(12) United States Patent
Chang

(10) Patent No.: US 11,527,625 B1
(45) Date of Patent: Dec. 13, 2022

(54) ELECTRICAL PERFORMANCE AND RELIABILITY OF A SEMICONDUCTOR DEVICE COMPRISING CONTINUOUS DIFFUSION STRUCTURES

(71) Applicant: MARVELL ASIA PTE, LTD., Singapore (SG)

(72) Inventor: Runzi Chang, Saratoga, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 153 days.

(21) Appl. No.: 16/917,946

(22) Filed: Jul. 1, 2020

Related U.S. Application Data

(60) Provisional application No. 62/869,926, filed on Jul. 2, 2019.

(51) Int. Cl.
*H01L 29/40* (2006.01)
*H01L 21/765* (2006.01)
*H01L 27/088* (2006.01)

(52) U.S. Cl.
CPC .......... *H01L 29/404* (2013.01); *H01L 21/765* (2013.01); *H01L 27/088* (2013.01)

(58) Field of Classification Search
CPC .... H01L 29/404; H01L 21/765; H01L 27/088
USPC ........................................................ 257/401
See application file for complete search history.

(56) References Cited

U.S. PATENT DOCUMENTS

| | | | |
|---|---|---|---|
| 8,753,941 B1* | 6/2014 | Benaissa | H01L 29/1083 438/231 |
| 2005/0199955 A1* | 9/2005 | Ohguro | H01L 27/0274 257/365 |
| 2005/0224893 A1* | 10/2005 | Arai | H01L 29/40114 257/E21.209 |
| 2006/0043493 A1* | 3/2006 | Uchiyama | H01L 29/518 257/E21.639 |
| 2008/0293207 A1* | 11/2008 | Koutny, Jr. | H01L 27/1052 257/E21.409 |
| 2009/0053885 A1* | 2/2009 | Sakamoto | H01L 21/31133 257/E21.294 |
| 2015/0228645 A1* | 8/2015 | Chuang | H01L 29/66636 438/290 |
| 2020/0006152 A1* | 1/2020 | Su | H01L 27/088 |
| 2020/0051981 A1* | 2/2020 | Yang | H01L 29/7851 |

FOREIGN PATENT DOCUMENTS

CN 106935591 A * 7/2017 ........ H01L 27/11563

* cited by examiner

*Primary Examiner* — Mohammad M Hoque

(57) ABSTRACT

A semiconductor device includes a core gate and a pair of isolation gates. The core gate has a first stack of two or more layers, the first stack including at least (i) a first dielectric layer having a first thickness and (ii) a first electrode layer. The isolation gates are formed on first and second sides of the core gate. The isolation gates are configured to electrically isolate the core gate. At least one of the isolation gates has a second stack of two or more layers, the second stack including at least (i) a second dielectric layer having a second thickness greater than the first thickness and (ii) a second electrode layer.

22 Claims, 2 Drawing Sheets

US 11,527,625 B1

ELECTRICAL PERFORMANCE AND RELIABILITY OF A SEMICONDUCTOR DEVICE COMPRISING CONTINUOUS DIFFUSION STRUCTURES

CROSS-REFERENCE TO RELATED APPLICATIONS

This application claims the benefit of U.S. Provisional Patent Application 62/869,926, filed Jul. 2, 2019, whose disclosure is incorporated herein by reference.

FIELD OF THE DISCLOSURE

The present disclosure relates generally to semiconductor devices, and particularly to methods and systems for improving reliability and reducing leakage current in semiconductor devices.

BACKGROUND

Semiconductor devices, which are produced using state-of-the-art technology nodes, are prone to quality and reliability degradation for various reasons, such as leakage current and dielectric breakdown occurring in gate structures of the device.

The description above is presented as a general overview of related art in this field and should not be construed as an admission that any of the information it contains constitutes prior art against the present patent application.

SUMMARY

An embodiment that is described herein provides a semiconductor device including a core gate and a pair of isolation gates. The core gate has a first stack of two or more layers, the first stack including at least (i) a first dielectric layer having a first thickness and (ii) a first electrode layer. The isolation gates are formed on first and second sides of the core gate. The isolation gates are configured to electrically isolate the core gate. At least one of the isolation gates has a second stack of two or more layers, the second stack including at least (i) a second dielectric layer having a second thickness greater than the first thickness and (ii) a second electrode layer.

In some embodiments, the isolation gates are positioned between the core gate and one or more adjacent devices, and are configured to reduce leakage currents between the core gate and the one or more adjacent devices. In other embodiments, the semiconductor device includes a substrate having a first section containing a first concentration of first charge carriers, and multiple second sections formed within the first section and containing a second concentration of second charge carriers that is greater than the first concentration, and at least part of the core gate and at least part of the isolation gates are formed on the first section and between the second sections. In yet other embodiments, the semiconductor device includes one or more conductive rails coupled to at least one of: (i) the first electrode layer, (ii) the second electrode layer, and (iii) the second section, the conductive rails being configured to exchange electrical signals between the semiconductor device and one or more additional devices.

In an embodiment, the first and second sections and the core gate and isolation gates together include a continuous diffusion (CNOD) structure, which is configured to electrically isolate the device from adjacent devices. In another embodiment, the second side is opposite the first side, and each of the second sections includes: (i) a source located at the first side of the core gate, and (ii) a drain located at the second side of the core gate, such that the core gate, the source and the drain together form a P-type metal-oxide-semiconductor (PMOS) transistor or an N-type metal-oxide-semiconductor (NMOS) transistor. In yet another embodiment, the first and second dielectric layers include silicon dioxide, the first thickness is smaller than 1.5 nm and the second thickness is greater than 1.5 nm.

There is additionally provided, in accordance with an embodiment that is described herein, an integrated circuit including a core transistor and an input-output (IO) transistor. The core transistor includes a core gate and a pair of isolation gates. The core gate has a first stack of two or more layers, the first stack including at least (i) a first dielectric layer having a first thickness and (ii) a first electrode layer. The isolation gates, which are formed on first and second sides of the core gate, are configured to electrically isolate the core gate. At least one of the isolation gates has a second stack of two or more layers, the second stack including at least (i) a second dielectric layer having a second thickness greater than the first thickness and (ii) a second electrode layer. The IO transistor includes an IO gate having a third stack of two or more layers, the third stack including at least (i) a third dielectric layer having a third thickness, and (ii) a third electrode layer.

There is further provided, in accordance with an embodiment that is described herein, a semiconductor device including a core gate and first and second isolation gates. The core gate is formed by producing on a substrate (i) a first dielectric layer having a first thickness, and (ii) a first electrode layer formed over the first dielectric layer. The first and second isolation gates are formed on respective first and second sides of the core gate, by producing on the substrate (i) a second dielectric layer having a second thickness, greater than the first thickness, and (ii) a second electrode layer formed over the second dielectric layer.

The present disclosure will be more fully understood from the following detailed description of the embodiments thereof, taken together with the drawings in which:

DETAILED DESCRIPTION OF EMBODIMENTS

Figure 1A:
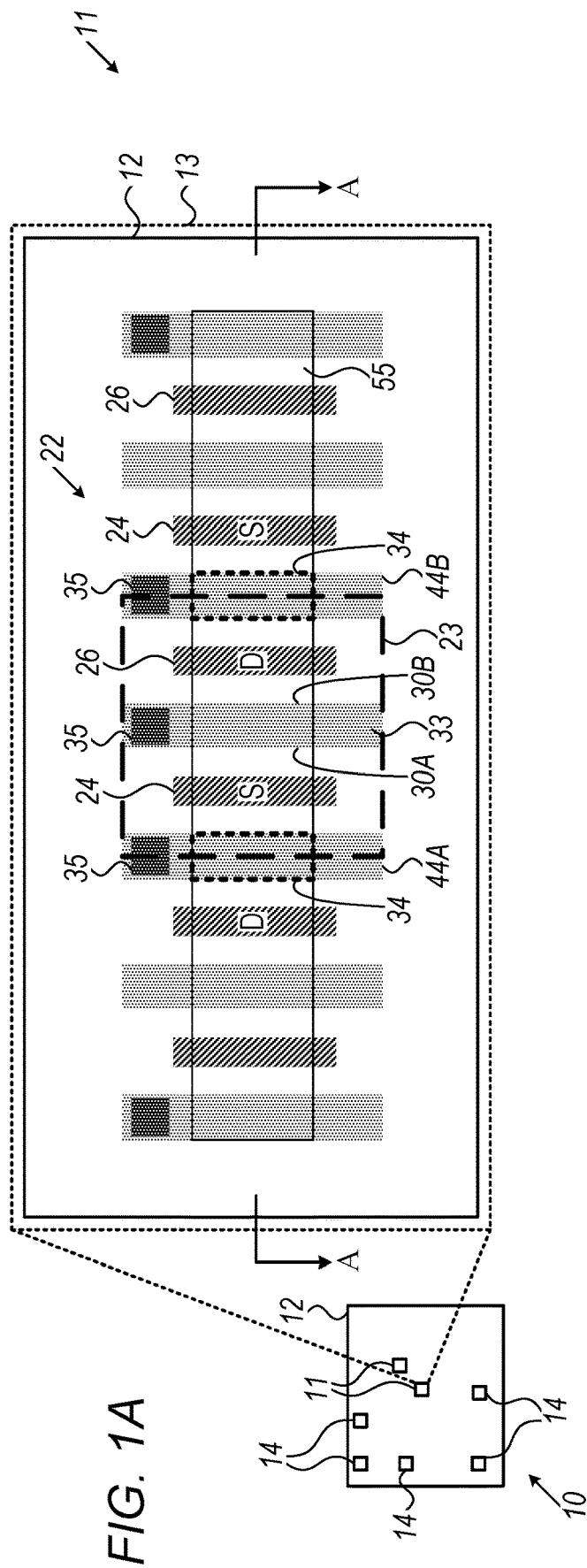
FIG. 1A is a schematic top view of an integrated circuit (IC), in accordance with an embodiment that is described herein.

Integrated circuits (ICs) of electronic systems used in various applications, such as in autonomous driving, artificial intelligence (AI), and the 5$^{th}$ Generation (5G) cellular mobile communications, need to comply with strict quality and reliability requirements. For example, excess leakage current between adjacent devices reduces the electrical performance of the IC and constitutes a quality issue, and electrical breakdown of a gate dielectric layer of a core gate constitutes a severe issue of device reliability.

Embodiments that are described herein provide an improved layered-structure of an IC library cell, referred to herein as a continuous diffusion (CNOD) structure, which is configured to substantially reduce the level of leakage current between adjacent transistors of the IC, and to prevent electrical breakdown of a gate dielectric layer of the transistors.

In some embodiments, the CNOD structure of the IC comprises a core transistor, which comprises a core gate and a pair of isolation gates formed on both sides of the core gate. The isolation gates are configured to electrically isolate the core gate from adjacent devices of the IC. In some embodiments, the core gate has a stack of two or more layers comprising a gate dielectric layer having a predefined thickness, and an electrode layer. Each isolation gate has a stack of two or more layers comprising a dielectric layer having a given thickness greater than the predefined thickness of the gate dielectric layer of the core gate, and an electrode layer, typically but not necessarily similar to the electrode layer of the core gate. The thicker dielectric layer on the isolation gates improves the electrical isolation between the core transistor and adjacent devices, as well as the reliability of the core transistor, as will be elaborated herein.

In some embodiments, the CNOD structure further comprises one or more Input-Output (IO) transistors that each comprises an IO gate, which typically but not necessarily, has a structure of stacked layers similar to that of the isolation gates described above. This uniformity simplifies the fabrication process of the CNOD device, in accordance with an embodiment. An example fabrication flow is outlined herein.

In some embodiments, the gate dielectric comprises silicon dioxide and the gate electrode comprises polycrystalline silicon. In other embodiments, the gate comprises a high-k metal gate (HKMG) structure, such that the dielectric layer comprises material or compound having a dielectric constant (k) larger than that of silicon dioxide, and the electrode layer comprises metal, which is compatible with the high-k dielectric layer.

In some embodiments, the CNOD structure of the IC comprises additional layers and sections, such as but not limited to diffusion and source/drain of the transistors, and conductive rails configured to exchange electrical signals between the transistor, and one or more additional devices of the IC.

The description above is presented as a general overview of embodiments of the present disclosure, which are described in detail herein.

FIG. 1A is a schematic top view of an integrated circuit (IC) 10, in accordance with an embodiment that is described herein. In some embodiments, IC 10 comprises one or more core devices 11 and one or more input-output (IO) devices 14, which are formed on a substrate 12, typically a single-crystal of silicon.

In some embodiments, IO devices 14 are configured to exchange signals between IC 10 and other ICs on an electronic system (not shown), and therefore, are typically located at the periphery of IC 10. Core devices 11, also referred to herein as semiconductor devices (SDs), are configured to process, inter alia, the exchanged signals received from IO devices 14.

In some embodiments, the disclosed semiconductor devices, such as core device 11, are useful, for example, for implementing core transistors (also referred to as high-speed transistors) in various types of integrated circuits, such as in IC 10.

Reference is now made to an inset 13 showing core device 11, in accordance with an embodiment. In some embodiments, core device 11 comprises a core transistor 22, which is shown within a dashed-line frame 23 and is formed on a surface 54 of substrate 12, over a diffusion section referred to herein as diffusion 55.

Figure 1B:
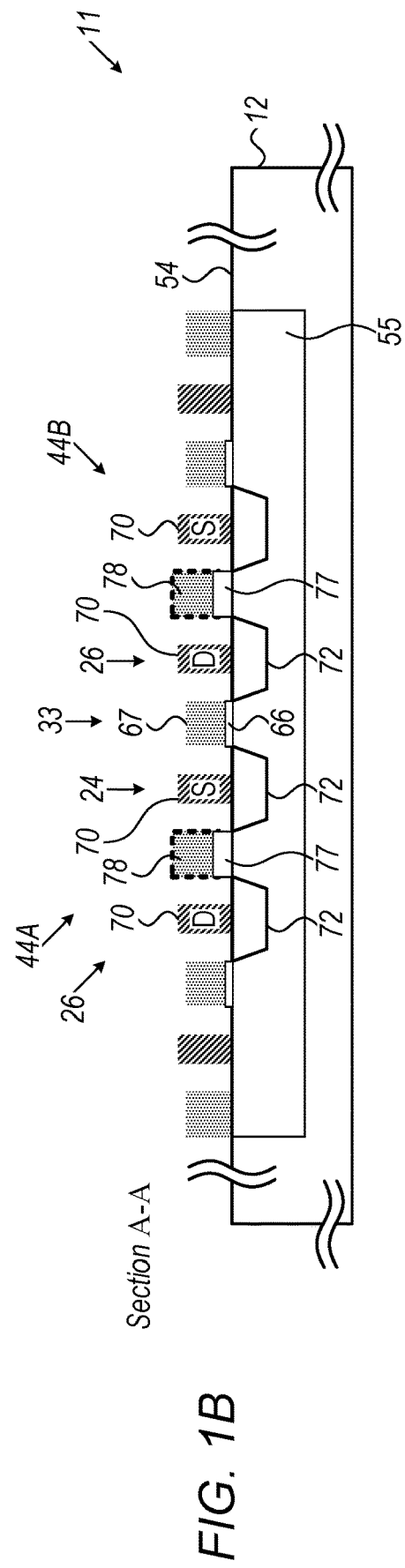
FIG. 1B is a schematic sectional view of a core device of the IC of FIG. 1, in accordance with an embodiment that is described herein.

In some embodiments, core transistor 22 of core device 11 comprises a core gate 33, which comprises a stack of two or more layers formed over diffusion 55 and described in detail in FIG. 1B, which is an AA sectional view of core device 11. Core transistor 22 comprises a pair of similar isolation gates 44A and 44B, formed at a predefined distance from opposite sides 30A and 30B of core gate 33, respectively.

In some embodiments, each of isolated gate 44A and isolated gate 44B, comprises a stack of two or more layers, also formed over diffusion 55 and described in detail in FIG. 1B below. As shown in inset 13, core transistor 22 is formed using a continuous diffusion (CNOD) structure, which may be used as a library cell for designing devices of IC 10. Note that by using the CNOD structure, a designer may increase the number of active devices formed on IC 22, and therefore the functionality of IC 22. Moreover, the CNOD structure is configured to electrically isolate core transistor 22 from adjacent devices, as described herein.

In some embodiments, core transistor 22 comprises a source 24 and a drain 26 described in detail below. The terms "source" and "drain" refer to areas in substrate 12 comprising charge carriers that, when core transistor 22 is activated, are conducted in a transistor channel below core gate 33, as described in detail in FIG. 1B below. Note that source 24 and drain 26 are typically similar to one another and are defined in accordance with the direction of the conducted charge carriers.

In some embodiments, source 24 is located on a first side of core gate 33, e.g., on side 30A, and drain 26 located on a second side of core gate 33, e.g., on side 30B, so that core gate 33, source 24 and drain 26 together form a P-type metal-oxide-semiconductor (PMOS) transistor or an N-type metal-oxide-semiconductor (NMOS) transistor.

In some embodiments, diffusion 55 has a first concentration of first charge carriers, which are typically implanted, or formed using a diffusion process, in substrate 12. Each of source 24 and drain 26 has a second concentration of second charge carriers, which is greater than the first concentration, and is formed in substrate 12 and/or in semiconductor fins of a fin field-effect transistor (finFET). For example, when core transistor 22 comprises a PMOS transistor, diffusion 55 contains N-type charge carriers, and each of source 24 and drain 26 contains P-type charge carriers at a greater concentration then that of diffusion 55. As shown in inset 13, at least part of core gate 33 and at least part of isolated gates 44A and 44B are formed on diffusion 55 and having sections of source 24 and drain 26 therebetween.

In some embodiments, a section 34 of isolated gates 44A and 44B is configured to electrically isolate core gate 33, for example, by reducing leakage currents between core gate 33 and one or more adjacent devices (not shown) of IC 10.

In some embodiments, core transistor 22 comprises one or more conductive rails, in the present example gate contacts 35 and other types of metal interconnects, which are configured to exchange electrical signals between one or more gates of core transistor 22 (e.g., core gate 33) and one or more additional devices of IC 10. In some embodiments, core transistor 22 may comprise other conductive rails (shown in FIG. 1B below), which are configured to exchange electrical signals between source and/or drain 26, and the aforementioned one or more additional devices of IC 10.

FIG. 1B is a schematic AA sectional view of core device 11, in accordance with an embodiment that is described herein. In some embodiments, core gate 33 comprises a dielectric layer, referred to herein as a core-gate oxide 66. In some embodiments, core gate 33 comprises an electrode layer, referred to herein as a core-gate electrode 67, in the present example, core-gate electrode 67 comprises any suitable type of metal.

In principle, it is possible to use polycrystalline silicon, also referred to as poly-silicon or poly, in core-gate electrode 67. However, when reducing the dimensions of core gate 33, a depletion region may be formed at the interface of the poly-silicon of core-gate electrode 67 and the gate oxide of core-gate oxide 66. As core device 11 continues to scale down, this poly-silicon depletion becomes larger, and a larger fraction of the oxide thickness limits the gate oxide capacitance. Moreover, when applying voltage to core gate 33, core-gate oxide 66 is prone to a breakdown (described below), which is a severe reliability failure that is critical in safety-critical technologies, implementations and applications, such as but not limited to, autonomous driving, artificial intelligence (AI), and the 5th Generation (5G) cellular mobile communications applications.

The negative effects of poly-depletion are caused by a reduction in inversion layer charge density and result in a degradation of device performance. Therefore, apart from gate oxide thickness, poly depletion layer thickness needs to be minimized as well. Moreover, gates based on poly-silicon can also be incompatible with high-K dielectric (the term "k" refers to a dielectric constant) because of various effects, such as threshold voltage pinning and photon scattering, which can make it difficult to obtain low threshold voltage and reduce the mobility of the aforementioned charge carriers in the transistor channel of core gate 33, in some cases.

In some embodiments, core gate 33 comprises a metal gate, instead of a poly gate, which eliminates the poly-depletion effect described above. Moreover, a metal gate also enables the use of materials having a dielectric constant larger than that of silicon dioxide, in core-gate oxide 66. Such high-k dielectric materials facilitate a reduced thickness of the gate dielectric, which in turn results in an improved electrical performance of IC 22, such as higher mobility of the charge carriers.

In some embodiments, core gate 33 comprises a high-k metal gate (HKMG) structure, wherein core-gate electrode 67 comprises any suitable type of metal, and the thickness of the high-k material of core-gate oxide 66 is equivalent to about 1 nm of gate oxide. In other embodiments, core-gate oxide 66 may comprise silicon dioxide.

During the operation of IC 10, core transistor 22 is constantly connected to power rails, such as voltage drain drain (Vdd) applied to a PMOS device or ground (GRND) applied to an NMOS device, so as to turn core transistor 22 off and to obtain isolation between core transistor 22 and other transistors of IC 10. However, leakage currents may occur between core gate 33 of core transistor 22, and adjacent devices of IC 10. Moreover, various events of glitches and noise of the aforementioned signals may occur in core transistor 22. For example, the source side of core transistor 22 may, for some period, exceed the voltages in the power rails (e.g., higher than Vdd in PMOS or lower than GRND in NMOS). Such device quality degradation may induce increased levels of leakage currents between core transistor 22 and adjacent devices of IC 10.

In addition to the quality degradation described above, because gate contact 35 is connected to the power rails (not shown) during the operation of IC 10, and core transistor 22 is typically under voltage stress across different sides of core-gate oxide 66, the thin dielectric layer of core-gate oxide 66 may undergo a reliability degradation, which may cause a reliability-failure of the device, such as a Time-Dependent Dielectric Breakdown (TDDB) failure. Such device reliability failures may be harmful for the functionality of an electronic system containing IC 10.

In some embodiments, each of isolated gates 44A and 44B comprises a gate electrode layer, referred to herein as an isolated gate electrode 78, typically but not necessarily having a structure, thickness and materials similar to that of core-gate oxide 66 described above.

In some embodiments, each of isolated gates 44A and 44B comprises a dielectric layer referred to herein as an isolated gate oxide 77, typically comprising the same dielectric material of core-gate oxide 66, but of greater thickness. For example, isolated gate oxide 77 may have a thickness equivalent to about 2.5 nm of silicon dioxide, whereas as described above, core-gate oxide 66 may have a thickness equivalent to about 1 nm of silicon dioxide. As described above, core-gate oxide 66 and isolated gate oxide 77 may comprise silicon dioxide, and therefore, may have an actual thickness of about 1 nm and about 2.5 nm, respectively. In other embodiments, core-gate oxide 66 and isolated gate oxide 77 may have any other suitable thickness, for example, core-gate oxide 66 may have any suitable thickness smaller than about 1.5 nm and isolated gate oxide 77 may have a thickness greater than about 1.5 nm.

In the context of the present disclosure and in the claims, the terms "about" or "approximately" for any numerical values or range of numerical values, indicate a suitable dimensional tolerance that allows the part or collection of components, or a physical parameters such as thickness, to function for its intended purpose as described herein.

In some embodiments, forming the dielectric layer of isolated gate oxide 77 substantially thicker than that of core-gate oxide 66, may allow several improvements in operation of core transistor 22. Such improvements include, for example, (a) increasing the ability of isolated gates 44A and 44B to electrically isolate core gate 33, resulting in a reduced level (or elimination) of undesired leakage currents, (b) improving control for turning core transistor 22 off, even at an increased operational voltage of IC 10, and (c) improving the reliability of core transistor 22, for example by preventing breakdown of thin dielectric layers of core transistor 22, such as isolated gate oxide 77 and possibly core-gate oxide 66.

In some embodiments, each of source 24 and drain 26 are indicative of a profile of ions implanted in substrate 12, referred to herein as source/drain implant region 72, for producing the charge carriers in source 24 and drain 26. IC 10 comprises an electrically conductive contact, referred to herein as a source-drain contact 70, which is configured for connecting source/drain implant regions 72 of source 24 and drain 26 to the power rails. Source-drain contacts 70 are formed on top of surface 54 of substrate 12, and may comprise a silicide (or any other suitable) layer for improving the interface between the conductive (e.g., metal) layer of source-drain contact 70 and the semiconductor (e.g., silicon) of substrate 12. Note that diffusion 55 is formed (e.g., by ion implantation or diffusion) at a section of substrate 12, which is sufficiently-large to incorporate at least the elements of core transistor 22. The active sections of source 24 and drain 26 are formed between the gates of core transistor 22, e.g., between core gate 33, isolated gate 44A, and isolated gate 44B.

This particular configuration of core transistor 22 is shown by way of example, in order to illustrate certain problems that are addressed by disclosed embodiments and to demonstrate the application of these embodiments in enhancing the performance of such a device. The disclosed techniques, however, are by no means limited to this specific sort of example device, and the principles described herein may similarly be applied to other sorts of devices, such as but not limited to transistors based on gate-all-around (GAA) structures, or other sorts of transistor structures.

Moreover, the configuration of core transistor 22 seen in the figures is simplified for the sake of conceptual clarity. For example, core gate 33 and isolated gates 44A and 44B of core transistor 22 typically comprise additional layers and structures, which are not related to the disclosed solution and therefore are omitted intentionally from the description of core transistor 22.

In other embodiments, core-gate oxide 66 and isolated gate oxide 77 may comprise different types of dielectric materials. For example, core-gate oxide 66 may comprise a low-k dielectric layer, such as silicon dioxide, whereas isolated gate oxide 77 may comprise material having a dielectric constant substantially greater than that of silicon dioxide. Such embodiments, may result in similar thickness of core-gate oxide 66 and isolated gate oxide 77, but may require additional process operations, which may increase the fabrication costs, and may have device compatibility and process integration issues.

Figure 2:
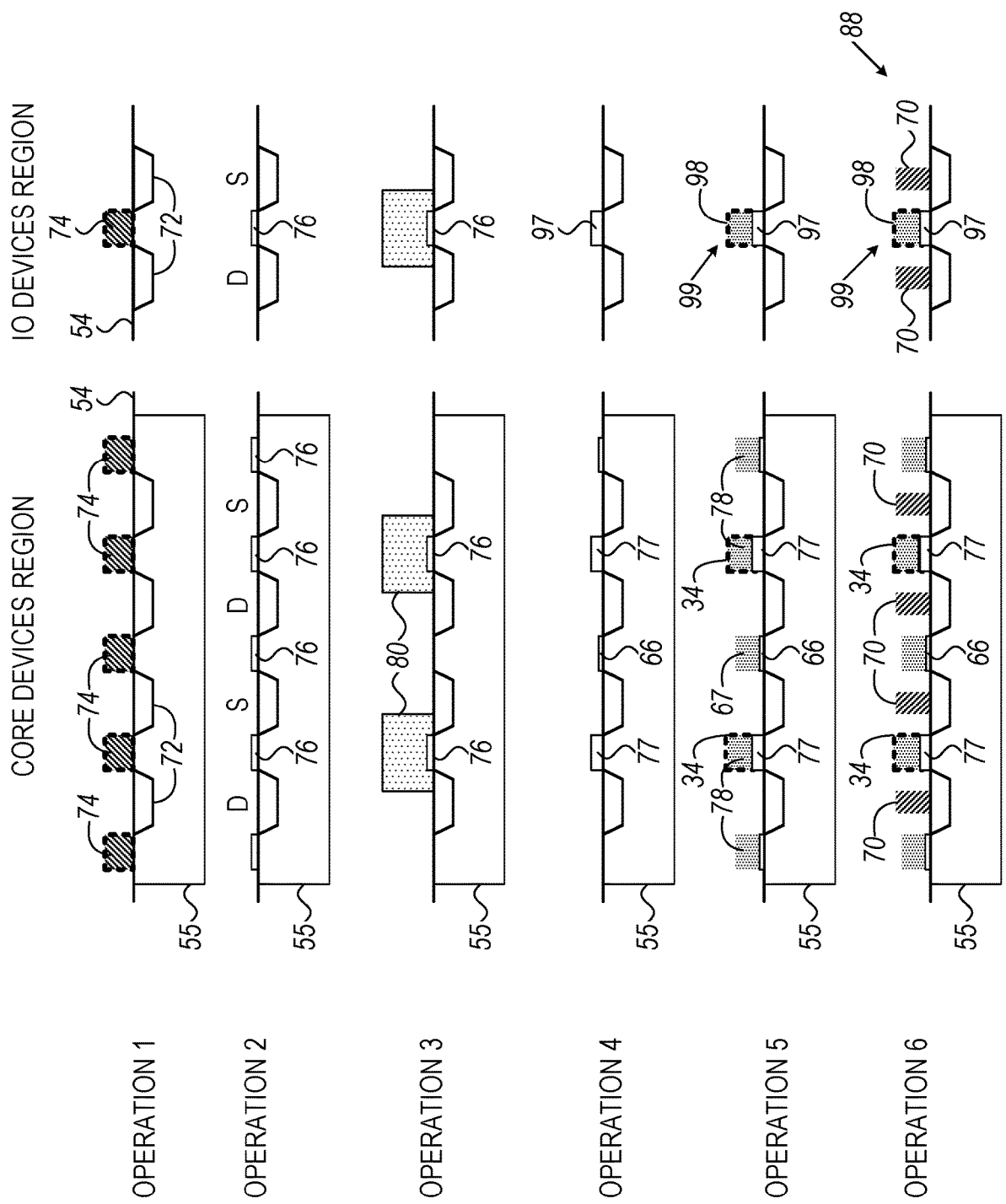
FIG. 2 is a diagram that schematically illustrates sectional views of a process sequence for producing input-output (IO) and core devices of the IC of FIG. 1, in accordance with an embodiment that is described herein.

FIG. 2 is a diagram that schematically illustrates a sectional view of a process sequence for producing IO device 14 and core transistor 22 of IC 10, in accordance with an embodiment that is described herein.

In some embodiments, IO device 14 comprises one or more IO transistors 88, each IO transistor 88 comprising an IO gate 99 having a stack of two or more layers, such as an IO electrode layer 98 formed on an IO dielectric layer 97.

In some embodiments, IO transistor 88 is configured to exchange, via the aforementioned conductive rails (e.g., gate contacts 35 or other metal interconnects), high-voltage signals between IC 10 and one or more additional ICs of the electronic system. For example, core transistor 22 of core device 11 is configured to operate at a typical voltage level of about 0.75V, whereas IO transistor 88 of IO device 14 is configured to operate at a typical voltage level of about 1.2V.

In some embodiments, IO dielectric layer 97 may have a thickness larger than that of core-gate oxide 66, e.g., similar to that of isolated gate oxide 77, so as to prevent, or at least substantially reduce the frequency, of the quality and reliability degradation described in FIGS. 1A and 1B above.

In some embodiments, the method described below may apply the thickness of IO dielectric layer 97 to the thickness of isolated gates 44A and 44B, so as to reduce the leakage current, and to prevent Time-Dependent Dielectric Breakdown (TDDB) failures in core device 11, while using the process operations already implemented for producing IO dielectric layer 97 of IO device 14. Therefore, by implementing the method described herein, the process flow for improving the aforementioned attributes of core device 11, is using existing process operations (e.g., in a different order) without adding operations to the existing process flow, and therefore, are not increasing the production costs of IC 10.

The process begins at an operation 0 with designing the lithography process of the mask of IO dielectric layer 97 (of IO gate 99) and isolated gate oxide (of isolated gates 44A and 44B) to have the same tone (e.g., dark or clear).

At the following operations, the method applies any suitable Complementary Metal Oxide Semiconductor (CMOS) processes, such as but not limited to: (a) thin-film (TF) deposition using chemical vapor deposition (CVD), metalorganic CVD (MOCVD), physical vapor deposition (PVD) also referred to herein as sputtering, electroplating (EP) and electrochemical plating (ECP) and atomic layer deposition (ALD), (b) various types of reactive-ion etching (RIE), wet etching, and other types of etching processes, (c) photoresist (PR)-based photolithography, (d) diffusion processes (e) various types of ion implantation and curing processes, (f) polishing and planarization processes, such as chemical mechanical polishing (CMP) or applying polyimide and spinning for obtaining planar surfaces, and (g) various processes of mask removal, such as but not limited to photoresist asking, photoresist stripping and hard-mask etching.

At an operation 1, some of the CMOS processes may be used for applying patterns to substrate 12. For example: (a) active and isolation areas are formed in substrate 12, e.g., using shallow trench isolation (STI) techniques, (b) diffusion and/or ion implantation processes for obtaining the required concentration and profile of charge carriers (e.g., N-type) in diffusion 55 (note that some ODs 55 may be implanted with P-type, and the charge carriers are also formed at the designated regions of IO devices 14), (c) forming dummy poly gates 74 on surface 54 of substrate 12, (d) implanting ions for obtaining the required concentration (greater than that of diffusion 55) and profile of charge carriers (e.g., P-type) in designated regions of source/drain implant regions 72, (e) and additional processes such as but not limited to epitaxial (epi) layer growing, dielectric deposition and planarization (e.g., polish back) processes for exposing the dummy poly gates. In the context of the present disclosure, the term "dummy" refers to a sacrificial pattern or layer, which are formed for the sake of processing and are subsequently removed during the fabrication process, and that does not remain in the end-product, in the present example, IC 10.

At an operation 2, dummy poly gates 74 are selectively removed (e.g., using wet etching) so as to expose surface 54 of substrate 12 whereas source/drain implant regions 72 remains covered, e.g., by the dielectric layer formed in the dielectric deposition and planarization processes. Subsequently, a thick dielectric layer 76 (e.g., silicon dioxide or any other suitable gate dielectric layer) is formed on the exposed surface 54. Note that layer 76 is formed at the position of all the gates of IC 10, e.g., at the gates of core devices 11 and at the gates of IO devices 14. In the present example, the thickness of layer 76 is typically less than that of isolated gate oxide 77, as will be described in a subsequent process operation below. Moreover, the dielectric layer formed on source/drain implant regions 72 may serve as a diffusion barrier or a mask that prevents the formation of layer 76 on the surface of source/drain implant regions 72.

At an operation 3, a mask 80, which is the mask described in operation 0 above, is used in a lithography process for covering the intended locations of: (a) isolated gates 44A and 44B, and (b) IO gate 99. Note that mask 80 may comprise any mask suitable for preventing formation of undesired defects within and/or on the surface of layer 76. After applying mask 80, layer 76 is removed from surface 54 but at the intended locations of isolated gate 44A, isolated gate 44B, and IO gate 99. For example, after operation 3, layer 80 is removed from the intended locations of the core gates, such as core-gate oxide 66.

At an operation 4, mask 80 is removed and core-gate oxide 66 (e.g., about 1 nm of silicon dioxide or an equivalent thereof) is formed on surface 54 at the intended location of core gates, such as core-gate oxide 66, as well as on layer 76 at the intended locations of isolated gate 44A, isolated gate 44B, and IO gate 99. The formation of core-gate oxide 66 may be carried out using a diffusion process (for oxidizing surface 54) or an epitaxial deposition process (for depositing on surface 54 any suitable type of dielectric layer).

As described in operations 2 and 3 above, the thickness of layer 76, which remains at the intended locations of isolated gate 44A, isolated gate 44B, and IO gate 99, is typically less than that of isolated gate oxide 77. As described above, during operation 4, at least a partial thickness of core-gate oxide 66 may be deposited on the top surface of layer 76, so that a combination of both layers together, form isolated gate oxide 77. For example, assuming the specified thickness of isolated gate oxide 77 is about 2.5 nm: (i) in case core-gate oxide 66 is formed using a diffusion process, the thickness of layer 76 formed in operation 2 above, is slightly less than about 2.5 nm because during the diffusion process of operation 4, layer 76 acts as a diffusion barrier and therefore, in response to the diffusion process, a layer of silicon dioxide that is a few angstroms thick may be formed on the top surface of layer 76, (ii) in case core-gate oxide 66 is formed using a deposition process, the thickness of layer 76 formed in operation 2 above, is about 2.5 nm because during the deposition process of operation 4, an additional layer of silicon dioxide that is 1 nm thick is formed on the top surface of layer 76, so as to form isolated gate oxide 77 having the specified thickness of about 2.5 nm.

In some embodiments, the same process is carried out, at the same time, at the intended location of IO gate 99, so as to obtain the specified thickness of the gate dielectric of IO gate 99, shown as IO dielectric layer 97 in operation 4.

In some embodiments, using the method operations described above, isolated gate oxide 77 and IO dielectric layer 97 may have the same material and the same thickness. In other embodiments, isolated gate oxide 77 and IO dielectric layer 97 may be formed of a different material and/or be of a different thickness, for example, by using an additional mask in the production process.

Note that after concluding operation 4, the gate dielectric layer (e.g., core-gate oxide 66, isolated gate oxide 77 and IO dielectric layer 97) of all the gates of IC 10 is completed.

At an operation 5, the gate electrode layers, e.g., core-gate electrode 67, isolated gate electrode 78 and IO electrode layer 98, are formed, e.g., using any suitable metal deposition process. In some embodiments, core-gate electrode 67, isolated gate electrode 78 and IO electrode layer 98 may be formed at the same time, using the same process operation (or sequence of operations), and therefore, may comprise the same metallic material and the same thickness. In other embodiments, at least one of core-gate electrode 67, isolated gate electrode 78 and IO electrode layer 98 may be formed using a separate deposition process, so as to produce a different gate electrode for one or more gates of IC 10. Note that forming core-gate electrode 67, isolated gate electrode 78 and IO electrode layer 98 at the same time and a common process operation, typically reduces the production costs of IC 10.

At an operation 6 that concludes the method, source-drain contacts 70 are formed (e.g., using deposition, lithography, etching, and photoresist removal processes) for connecting source/drain implant regions 72 of source 24 and drain 26 to the power rails (not shown) of IC 10. As described in operation 5 above, the formation of source-drain contacts 70 may be carried out at the same time by applying a common sequence of process operations to all the gates of IC 10. In other embodiments, a separate sequence of process operations may be used for producing source-drain contacts 70 at different type of gates of IC 10, but each separate sequence of process operations is typically associates with an increase of the production costs of IC 10.

Although the embodiments described herein mainly address CNOD-based ICs having core gates and isolation gates, the methods and devices described herein can also be used in other applications, such as in general multiple gate-oxide mixed-signal CMOS technologies.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A semiconductor device, comprising:
a semiconductor substrate;
a core gate having a first stack of two or more layers, the first stack comprising at least (i) a first dielectric layer formed on the semiconductor substrate and having a first thickness, and (ii) a first electrode layer; and
first and second isolation gates, which are formed on first and second sides of the core gate, respectively, the first and second isolation gates configured to electrically isolate the core gate, wherein at least one of the first and second isolation gates has a second stack of two or more layers, the second stack comprising at least (i) a second dielectric layer, which is: (a) formed in direct contact with the semiconductor substrate, and (b) disjoint from the first dielectric layer, and has a second thickness greater than the first thickness and (ii) a second electrode layer.

2. The semiconductor device according to claim 1, wherein the first and second isolation gates are positioned between the core gate and one or more adjacent devices, and are configured to reduce leakage currents between the core gate and the one or more adjacent devices.

3. The semiconductor device according to claim 1, wherein the semiconductor substrate has a first section containing a first concentration of first charge carriers, and multiple second sections formed within the first section and containing a second concentration of second charge carriers that is greater than the first concentration, wherein at least part of the core gate and at least part of the isolation gates are formed on the first section and between the second sections.

4. The semiconductor device according to claim 3, comprising one or more conductive rails coupled to at least one of: (i) the first electrode layer, (ii) the second electrode layer, and (iii) the second section, the conductive rails being configured to exchange electrical signals between the semiconductor device and one or more additional devices.

5. The semiconductor device according to claim 3, wherein the first and second sections and the core gate and isolation gates together comprise a continuous diffusion (CNOD) structure, which is configured to electrically isolate the device from adjacent devices.

6. The semiconductor device according to claim 3, wherein the second side is opposite the first side, wherein each of the second sections comprises: (i) a source, which is formed within the semiconductor substrate and is located at the first side of the core gate, and (ii) a drain, which is formed within the semiconductor substrate and is located at the second side of the core gate, and wherein the core gate, the source and the drain together form a P-type metal-oxide-semiconductor (PMOS) transistor or an N-type metal-oxide-semiconductor (NMOS) transistor.

7. The semiconductor device according to claim 1, wherein the first and second dielectric layers comprise silicon dioxide, and wherein the first thickness is smaller than 1.5 nm and the second thickness is greater than 1.5 nm.

8. An integrated circuit, comprising:
a semiconductor substrate;
a core transistor, comprising:
  a core gate having a first stack of two or more layers, the first stack comprising at least (i) a first dielectric layer formed on the semiconductor substrate and having a first thickness, and (ii) a first electrode layer;
  first and second isolation gates, which are formed on first and second sides of the core gate, respectively, the first and second isolation gates configured to electrically isolate the core gate, wherein at least one of the first and second isolation gates has a second stack of two or more layers, the second stack comprising at least (i) a second dielectric layer, which is: (a) formed in direct contact with the semiconductor substrate, and (b) disjoint from the first dielectric layer, and has a second thickness greater than the first thickness and (ii) a second electrode layer; and
an input-output (IO) transistor, comprising an IO gate having a third stack of two or more layers, the third stack comprising at least (i) a third dielectric layer having a third thickness, and (ii) a third electrode layer.

9. The integrated circuit according to claim 8, wherein the second and third dielectric layers have a same thickness.

10. The integrated circuit according to claim 8, wherein the first and second isolation gates are positioned between the core gate and one or more adjacent devices, and are configured to reduce leakage currents between the core gate and the one or more adjacent devices.

11. The integrated circuit according to claim 8, wherein the semiconductor substrate has a first section containing a first concentration of first charge carriers, and multiple second sections formed within the first section and containing a second concentration of second charge carriers that is greater than the first concentration, wherein at least part of the core gate and at least part of the isolation gates are formed on the first section and between the second sections.

12. The integrated circuit according to claim 11, comprising one or more conductive rails coupled to at least one of: (i) the first electrode layer, (ii) the second electrode layer, and (iii) the second section, the conductive rails being configured to exchange electrical signals between the core transistor and one or more additional transistors.

13. The integrated circuit according to claim 11, wherein the first and second sections and the core gate and isolation gates together comprise a continuous diffusion (CNOD) structure, which is configured to electrically isolate the device from adjacent devices.

14. The integrated circuit according to claim 11, wherein the second side is opposite the first side, wherein each of the second sections comprises: (i) a source, which is formed within the semiconductor substrate and is located at the first side of the core gate, and (ii) a drain, which is formed within the semiconductor substrate and is located at the second side of the core gate, and wherein the core gate, the source and the drain of the core transistor, form a P-type metal-oxide-semiconductor (PMOS) transistor or an N-type metal-oxide-semiconductor (NMOS) transistor.

15. The integrated circuit according to claim 8, wherein at least the first and second dielectric layers comprise silicon dioxide, and wherein the first thickness is smaller than 1.5 nm and the second thickness is greater than 1.5 nm.

16. A semiconductor device, comprising:
a semiconductor substrate;
a core gate, formed by producing on the semiconductor substrate (i) a first dielectric layer having a first thickness, and (ii) a first electrode layer formed over the first dielectric layer; and
first and second isolation gates, formed on respective first and second sides of the core gate, by producing on the semiconductor substrate (i) a second dielectric layer, which is: (a) formed in direct contact with the semiconductor substrate, and (b) disjoint from the first dielectric layer, and has a second thickness greater than the first thickness, and (ii) a second electrode layer formed over the second dielectric layer.

17. The semiconductor device according to claim 16, wherein the first and second isolation gates are formed between the core gate and one or more adjacent devices.

18. The semiconductor device according to claim 16, wherein the semiconductor substrate has a first section containing a first concentration of first charge carriers, and multiple second sections formed within the first section and containing a second concentration of second charge carriers that is greater than the first concentration, wherein at least part of the core gate and at least part of the isolation gates are formed on the first section and between the second sections.

19. The semiconductor device according to claim 18, comprising one or more conductive rails coupled to at least one of: (i) the first electrode layer, (ii) the second electrode layer, and (iii) the second section, the conductive rails being configured to exchange electrical signals between the semiconductor device and one or more additional devices.

20. The semiconductor device according to claim 18, wherein the first and second sections and the core gate and isolation gates together comprise a continuous diffusion (CNOD) structure.

21. The semiconductor device according to claim 18, wherein the second side is opposite the first side, wherein each of the second sections comprises: (i) a source, which is formed within the semiconductor substrate and is located at the first side of the core gate, and (ii) a drain, which is formed within the semiconductor substrate and is located at the second side of the core gate, and wherein the core gate, the source and the drain together form a P-type metal-oxide-semiconductor (PMOS) transistor or an N-type metal-oxide-semiconductor (NMOS) transistor.

22. The semiconductor device according to claim 16, wherein the first and second dielectric layers comprise silicon dioxide, and wherein the first thickness is smaller than 1.5 nm and the second thickness is greater than 1.5 nm.

* * * * *